(12) United States Patent
Yoon et al.

(10) Patent No.: US 11,048,029 B2
(45) Date of Patent: Jun. 29, 2021

(54) COLOR CONVERSION PANEL, MANUFACTURING METHOD OF THE SAME, AND DISPLAY DEVICE INCLUDING THE SAME

(71) Applicant: SAMSUNG DISPLAY CO., LTD., Yongin-si (KR)

(72) Inventors: Seon-Tae Yoon, Seoul (KR); Hae Il Park, Seoul (KR); Jung Hyun Kwon, Seoul (KR); Kwang Keun Lee, Osan-si (KR); Jun Han Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 179 days.

(21) Appl. No.: 16/365,518

(22) Filed: Mar. 26, 2019

(65) Prior Publication Data

US 2019/0219752 A1    Jul. 18, 2019

Related U.S. Application Data

(63) Continuation of application No. 15/334,103, filed on Oct. 25, 2016, now Pat. No. 10,281,629.

(30) Foreign Application Priority Data

Nov. 27, 2015    (KR) .......................... 10-2015-0167429

(51) Int. Cl.
  *G02B 27/00*    (2006.01)
  *G02B 5/28*    (2006.01)
  (Continued)

(52) U.S. Cl.
  CPC ......... *G02B 5/28* (2013.01); *G02F 1/133512* (2013.01); *G02F 1/133514* (2013.01); *G02F 1/133617* (2013.01); *H01L 27/322* (2013.01); *H01L 27/3248* (2013.01); *H01L*
  (Continued)

(58) Field of Classification Search
  CPC . G02B 5/28; G02B 1/14; G02B 5/003; G02B 5/20; G02B 5/201; G02B 5/22; G02F 1/133512; G02F 1/133514; G02F 1/133617; H01L 27/322; H01L 27/3248; H01L 51/5253
  USPC ....... 359/557, 580, 582, 586, 588, 589, 590, 359/885, 888, 891; 349/104, 105, 106, 349/107, 108, 109, 110, 122, 162
  See application file for complete search history.

(56) References Cited

U.S. PATENT DOCUMENTS 9,703,141 B2    7/2017    Dong et al.
9,740,041 B2    8/2017    Liang
(Continued)

FOREIGN PATENT DOCUMENTS

CN    1652642 A    8/2005
CN    102436092 A    5/2012
(Continued)

OTHER PUBLICATIONS

Chinese Office Action dated Sep. 3, 2020, for corresponding Chinese Patent Application No. 201611064220.6 (10 pages).

*Primary Examiner* — Arnel C Lavarias
(74) *Attorney, Agent, or Firm* — Lewis Roca Rothgerber Christie LLP

(57) ABSTRACT

A color conversion panel includes a substrate, a plurality of color conversion layers and a transmission layer on the substrate, a capping layer on the plurality of color conversion layers and the transmission layer, and a filter layer on the capping layer.

15 Claims, 10 Drawing Sheets

(51) Int. Cl.
*G02F 1/13357* (2006.01)
*G02F 1/1335* (2006.01)
*H01L 27/32* (2006.01)
*H01L 51/52* (2006.01)
G02F 1/1333 (2006.01)
G02F 1/1337 (2006.01)
G02F 1/1343 (2006.01)
G02F 1/1362 (2006.01)
G02F 1/1368 (2006.01)

(52) U.S. Cl.
CPC  51/5253 (2013.01); *G02F 1/1337* (2013.01); *G02F 1/1368* (2013.01); *G02F 1/133345* (2013.01); *G02F 1/133357* (2021.01); *G02F 1/133377* (2013.01); *G02F 1/133504* (2013.01); *G02F 1/133528* (2013.01); *G02F 1/134336* (2013.01); *G02F 1/136286* (2013.01); *G02F 2201/121* (2013.01); *G02F 2201/123* (2013.01); *G02F 2203/055* (2013.01); *H01L 27/3211* (2013.01); *H01L 27/3246* (2013.01); *H01L 51/5268* (2013.01); *H01L 51/5284* (2013.01)

(56) References Cited

U.S. PATENT DOCUMENTS

| | | |
|---|---|---|
| 2013/0128548 A1 | 5/2013 | Lin |
| 2014/0312339 A1 | 10/2014 | Fujita |
| 2014/0368766 A1 | 12/2014 | Shibata et al. |
| 2015/0085223 A1 | 3/2015 | Park et al. |

FOREIGN PATENT DOCUMENTS

| | | |
|---|---|---|
| CN | 103226259 A | 7/2013 |
| CN | 203465442 U | 3/2014 |
| CN | 104297984 A | 1/2015 |
| CN | 104570480 A | 4/2015 |
| CN | 105093682 A | 11/2015 |
| KR | 10-2006-0125347 A | 12/2006 |
| KR | 10-1110071 B1 | 2/2012 |
| KR | 10-2013-0104862 A | 9/2013 |

COLOR CONVERSION PANEL, MANUFACTURING METHOD OF THE SAME, AND DISPLAY DEVICE INCLUDING THE SAME

CROSS-REFERENCE TO RELATED APPLICATION

This application is a continuation of U.S. patent application Ser. No. 15/334,103, filed Oct. 25, 2016, which claims priority to and the benefit of Korean Patent Application No. 10-2015-0167429, filed Nov. 27, 2015, the entire content of both of which is incorporated herein by reference.

BACKGROUND

(a) Field

Aspects of embodiments of the present invention relate to a color conversion panel, a manufacturing method thereof, and a display device including the same.

(b) Description of the Related Art

Currently, among display devices, a liquid crystal display in which a field generating electrode is provided in two display panels is mainly used. A plurality of thin film transistors and pixel electrodes are arranged in a matrix at one display panel (hereinafter referred to as "a thin film transistor array panel"), and red, green, and blue color filters are disposed in the other display panel (hereinafter referred to as "a common electrode panel"), an entire surface of which is covered by a common electrode.

However, the display device generates light leakage in the polarizer and the color filter.

The above information disclosed in this Background section is for enhancement of understanding of the background of the invention and therefore it may contain information that does not form the prior art.

SUMMARY

Aspects of embodiments of the present invention are directed to a color conversion panel with improved (e.g., increased) contrast ratio and color reproducibility, and a display device including the same.

According to some embodiments of the present invention, there is provided a color conversion panel including: a substrate; a plurality of color conversion layers and a transmission layer on the substrate; a capping layer on the plurality of color conversion layers and the transmission layer; and a filter layer on the capping layer.

In an embodiment, the capping layer covers each upper surface and each lateral surface of the plurality of color conversion layers and the transmission layer.

In an embodiment, the color conversion panel further includes a light blocking member between adjacent layers of the plurality of color conversion layers and the transmission layer.

In an embodiment, the capping layer includes an inorganic material.

In an embodiment, the capping layer includes a non-oxidizing material.

In an embodiment, the capping layer includes a silicon nitride ($SiN_x$).

In an embodiment, a thickness of the capping layer is less than about 1 μm.

In an embodiment, the capping layer is formed below about 100° C.

According to some embodiments of the present invention, there is provided a method for manufacturing a color conversion panel, the method including: forming a plurality of color conversion layers on a substrate; depositing a capping layer on the plurality of color conversion layers; and depositing a filter layer on the capping layer, wherein the capping layer is deposited at a temperature below about 100° C.

In an embodiment, the capping layer includes an inorganic material, and wherein the deposition of the filter layer is performed in a high temperature process.

In an embodiment, the capping layer includes a non-oxidizing material.

In an embodiment, the capping layer includes a silicon nitride ($SiN_x$).

In an embodiment, a thickness of the capping layer is less than about 1 μm.

According to some embodiments of the present invention, there is provided a display device including: a display panel; and a color conversion panel on the display panel, wherein the color conversion panel includes: a substrate, a plurality of color conversion layers and a transmission layer on one surface of the substrate facing toward the display panel, a capping layer on one surface of the plurality of color conversion layers and the transmission layer facing toward the display panel, and a filter layer between the capping layer and the display panel.

In an embodiment, the capping layer covers each upper surface and each lateral surface of the plurality of color conversion layers and the transmission layer.

In an embodiment, the display device further includes a light blocking member between adjacent layers among the plurality of color conversion layers and the transmission layer.

In an embodiment, the capping layer includes an inorganic material.

In an embodiment, the capping layer includes a non-oxidizing material.

In an embodiment, the capping layer includes a silicon nitride ($SiN_x$).

In an embodiment, a thickness of the capping layer is less than about 1 μm.

Accordingly, the color conversion panel and the display device including the same, according to an exemplary embodiment of the present invention, have excellent contrast ratio and color reproducibility, thereby improving the display quality.

DETAILED DESCRIPTION

Figure 1:
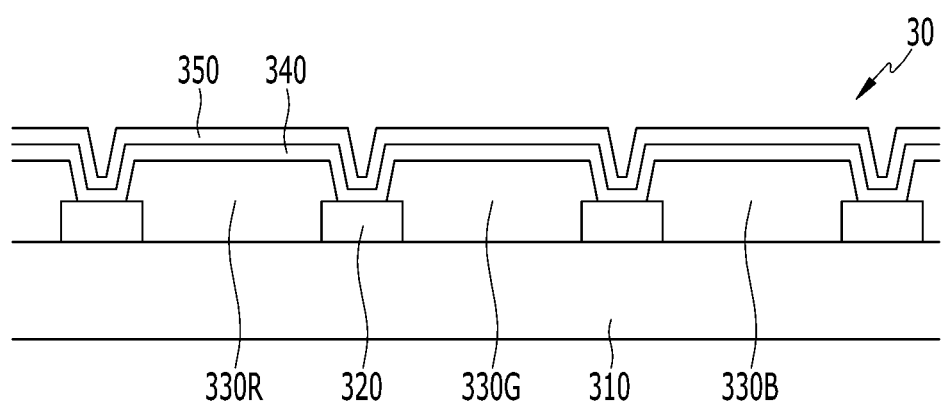
FIG. 1 is a cross-sectional view of a color conversion panel according to an exemplary embodiment of the present invention.

Aspects of embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Further, in the drawings, size and thickness of each element are arbitrarily represented for better understanding and ease of description, and embodiments of the present invention are not limited thereto. In the drawings, the thickness of layers, films, panels, regions, etc., are exaggerated for clarity. In the drawings, for better understanding and ease of description, the thickness of some layers and areas is exaggerated.

To realize a display device with reduced light leakage and high efficiency, aspects of embodiments of the present invention relate to a display device including a color conversion panel. Now, a color conversion panel according to an exemplary embodiment of the present invention will be described with reference to FIG. 1. FIG. 1 is a cross-sectional view of a color conversion panel according to an exemplary embodiment of the present invention.

As shown in FIG. 1, a color conversion panel 30 according to an exemplary embodiment of the present invention includes a plurality of color conversion layers 330R and 330G, a transmission layer 330B, and a light blocking member 320 positioned on a substrate 310.

The plurality of color conversion layers 330R and 330G may emit light by a method of converting a set or predetermined incident light into a different color light. As one example, the plurality of color conversion layers 330R and 330G may be a red color conversion layer 330R and a green color conversion layer 330G.

The transmission layer 330B may emit light by a method of transmitting the set or predetermined incident light. The transmission layer 330B may transmit blue light as one example.

The light blocking member 320 is positioned between the adjacent color conversion layers 330R and 330G, and between the adjacent color conversion layers 330B and 330G. In other words, the light blocking member 320 may define regions in which the red color conversion layer 330R, the green color conversion layer 330G, and the transmission layer 330B adjacent to each other are disposed.

The red color conversion layer 330R may include phosphors (or a phosphor layer) and/or quantum dots to convert the incident blue light into red light.

The green color conversion layer 330G may include phosphors (or a phosphor layer) and/or quantum dots to convert the incident blue light into green light.

The red color conversion layer 330R and the green color conversion layer 330G may further include the quantum dots for converting the color with or without the phosphor. In this case, the quantum dots may be selected from a Group II-VI compound, a Group III-V compound, a Group IV-VI compound, a Group IV element, a Group IV compound, and/or a combination thereof.

The Group II-VI compound may be selected from the group consisting of a binary compound selected from the group consisting of CdSe, CdTe, ZnS, ZnSe, ZnTe, ZnO, HgS, HgSe, HgTe, MgSe, MgS, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof; and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The Group IV-VI compound may be selected from the group consisting of a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

Also, a Group III-VI compound, a Group II-III-V compound, or a Group Group, and combinations thereof, may be included.

The Group III-VI compound may include a compound such as GaO, the Group II-III-V compound may include a compound such as InZnP, the Group compound may include a compound such as InZnSCdSe; however, embodiments of the present invention are not limited thereto.

In this case, the binary compound, the ternary compound, or the quaternary compound may exist in particles at a uniform concentration, or may exist in the same particle divided into states where concentration distributions are partially different. Further, the color conversion media layer may have a core/shell structure where one quantum dot surrounds another quantum dot. An interface between the core and the shell may have a concentration gradient, such that a concentration of an element existing in the shell is gradually reduced nearing the center thereof.

The quantum dot may have an emission wavelength spectrum having a full width at half maximum (FWHM) of about 45 nm or less, preferably about 40 nm or less, and more preferably about 30 nm or less, in which range the color purity or the color reproducibility may be improved (e.g., increased). In addition, because light emitted by the quantum dot is emitted in all directions, a viewing angle of light may be improved (e.g., increased).

In addition, the quantum dot is not specifically limited to have shapes that are generally used in the technical field related to embodiments of the present invention, and more specifically, may have a spherical shape (such as in a nano-particle), a pyramidal shape, a multi-arm shape, or a cubic shape, or may be a nanotube, a nanowire, a nanofiber, a planar nano-particle, and/or the like.

When the red color conversion layer 330R includes the red phosphor, the red phosphor may be one material among (Ca, Sr, Ba)S, (Ca, Sr, Ba)$_2$Si$_5$N$_8$, CaAlSiN$_3$, CaMoO$_4$, and Eu$_2$Si$_5$N$_8$, although it is not limited thereto. The red color conversion layer 330R may include at least one kind of red phosphor.

When the green color conversion layer 330G includes the green phosphor, the green phosphor may be one material among yttrium aluminum garnet (YAG), (Ca, Sr, Ba)$_2$SiO$_4$, SrGa$_2$S$_4$, BAM, α-SiAlON, β-SiAlON, Ca$_3$Sc$_2$Si$_3$O$_{12}$, Tb$_3$Al$_5$O$_{12}$, BaSiO$_4$, CaAlSiON, and (Sr$_{1-x}$Ba$_x$)Si$_2$O$_2$N$_2$, although it is not limited thereto. The green color conversion layer 330G may include at least one kind of green phosphor. In this case, x may be any number between 0 and 1.

The transmission layer 330B may be a polymer material for transmitting blue light supplied from a light assembly. For example, the transmission layer 330B corresponding to the region for emitting the blue light emits the incident blue light without the additional phosphors (or phosphor layer) or quantum dots.

The materials of the red color conversion layer 330R, the green color conversion layer 330G, the transmission layer 330B, and the light blocking member 320 may be photosensitive resins as one example, and accordingly, they may be formed through a photolithography process.

Also, the red color conversion layer 330R, the green color conversion layer 330G, the transmission layer 330B, and the light blocking member 320 may be formed through the printing process, and in this case, different materials from the photosensitive resin may be used in the manufacturing process.

In some embodiments, the color conversion layers and the light blocking member are formed through the photolithography process or the printing process however, embodiments of the present invention are not limited thereto, and other methods or other materials may be used.

At least one among the plurality of color conversion layers 330R and 330G and the transmission layer 330B, according to an exemplary embodiment of the present invention, may further include a scattering member. For example, a plurality of color conversion layers 330R and 330G and the transmission layer 330B may respectively include the scattering member, however they are not limited thereto, and the transmission layer 330B may include the scattering member, and the red color conversion layer 330R and the green color conversion layer 330G may not include the scattering member as another exemplary embodiment.

Each scattering member scatters the light emitted from at least one of the phosphors (or the phosphor layer) and the quantum dots so as to emit more light. As such, the light emission efficiency is increased.

In this case, a content of the scattering member included in the red color conversion layer 330R and the green color conversion layer 330G, and the content of the scattering member included in the transmission layer 330B may be different. The content of the scattering member included in the red color conversion layer 330R and the green color conversion layer 330G may be larger than the content of the scattering member included in the transmission layer 330B, as one example.

The scattering member included in the transmission layer 330B may adjust front luminance and lateral luminance of the light emitted from the transmission layer 330B to be uniform. Also, the scattering member included in the red color conversion layer 330R and the green color conversion layer 330G may increase the efficiency of light emission from the red color conversion layer 330R and the green color conversion layer 330G. As described above, the scattering member included in each color conversion layer may have different purposes, thereby being used in different contexts.

The material of the scattering members may be any suitable material that evenly scatters light, such as TiO$_2$, ZrO$_2$, Al$_2$O$_3$, In$_2$O$_3$, ZnO, SnO$_2$, Sb$_2$O$_3$, ITO, and/or the like.

Also, the scattering member may have a refractive index of about 1.5 or more. The color conversion layers 330R and 330G including the scattering members that have this refractive index, and the transmission layer 330B, may improve (e.g., increase) light emission efficiency.

Next, a capping layer 340 is positioned on the plurality of color conversion layers 330R and 330G, the transmission layer 330B, and the light blocking member 320. The capping layer 340 prevents or substantially prevents the color conversion layers 330R and 330G and the transmission layer 330B from being damaged by high temperature processes after forming the color conversion layers 330R and 330G and the transmission layer 330B. In more detail, in the process after forming the color conversion layers 330R and 330G and the transmission layer 330B, the phosphors (or phosphor layer) and the quantum dots included in the color conversion layers 330R and 330G and the transmission layer 330B may be damaged or extinguished by the moisture and the high temperature processes; however, this may be prevented or mitigated through the capping layer 340.

To protect the color conversion layers 330R and 330G and the transmission layer 330B, the capping layer 340 may be deposited to cover one exposed surface of the color conversion layers 330R and 330G and the transmission layer 330B. In detail, the capping layer 340 may cover the upper surface and the lateral surface of the plurality of color conversion layers 330R and 330G and the transmission layer 330B, respectively.

The capping layer 340 may be an inorganic material, such as a silicon nitride (SiN$_x$), and/or the like. However, it is not limited to this material, and the capping layer 340 may be made of any suitable material that is a non-oxidizing and transparent material. In this case, the capping layer 340 may be any suitable inorganic material having transmittance of more than about 95%.

The capping layer 340 may be formed at less than 100° C. Compared with a capping layer deposited at a high temperature, the capping layer 340 of embodiments of the present invention deposited at a low temperature may effectively prevent or mitigate degradation of the color conversion layer.

The thickness of the capping layer 340 may be less than 1 μm. A thickness of the capping layer 340 of 1 μm is sufficient to protect the plurality of color conversion layers 330R and 330G and the transmission layer 330B from high temperature or moisture.

A filter layer 350 is positioned on the capping layer 340. In the present specification, the capping layer 340 and the filter layer 350 are positioned on the light blocking member 320; however, embodiments of the present invention are not limited thereto, and the capping layer and the filter layer may be positioned on the color conversion layers 330R and 330G and the transmission layer 330B, and the light blocking member may be positioned on the filter layer, or the light blocking member may be positioned on the capping layer and the filter layer may be positioned on the capping layer and the light blocking member as another exemplary embodiment.

The filter layer 350 is a filter transmitting light of a set or predetermined wavelength and reflecting or absorbing light except for the light of the set or predetermined wavelength, such as an interference filter. The filter layer 350 may be manufactured of a structure in which a plurality of films having different refractive indexes are deposited. For example, the films may include polyethylene naphthalate (PEN), polystyrene (PS), and/or the like.

Further, the filter layer 350 may be deposited through the high temperature process. As one example, the deposition may be performed at a temperature from about 250° C. to about 350° C. As described above, according to the filter layer 350 deposited through the high temperature process, the extinction of the quantum dots included in the color conversion layers 330R and 330G may occur, however the capping layer 340 according to an exemplary embodiment of the present invention prevents or substantially prevents or mitigates the extinction.

The filter layer 350 again directs the light emitted in the direction opposite to the direction incident on the user to the color conversion layers 330R and 330G and the transmission layer 330B while the light is emitted or transmitted in the color conversion layers 330R and 330G and the transmission layer 330B, thereby improving (e.g., increasing) the light emission efficiency. In some exemplary embodiments, the filter layer 350 may be omitted. The above-described color conversion panel provides excellent color reproducibility and light emission efficiency.

Figure 2:
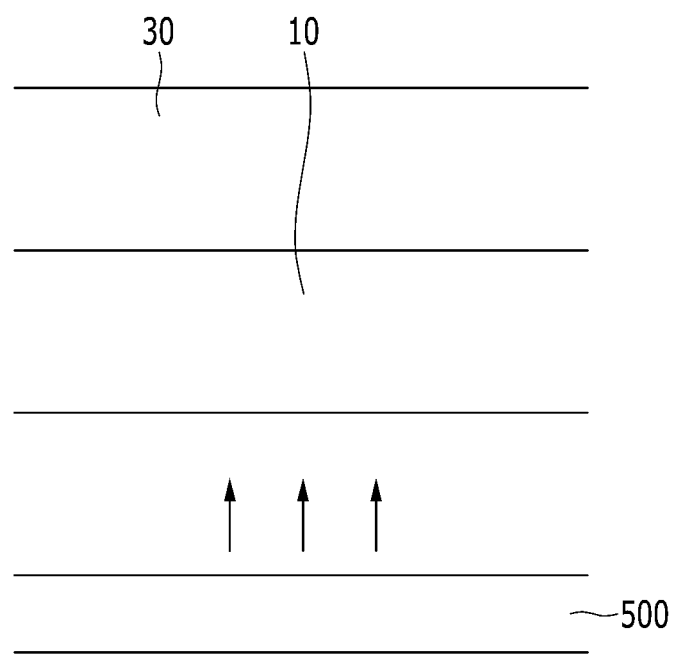
FIG. 2 is a schematic cross-sectional view of a display device according to an exemplary embodiment of the present invention.
Figure 3:
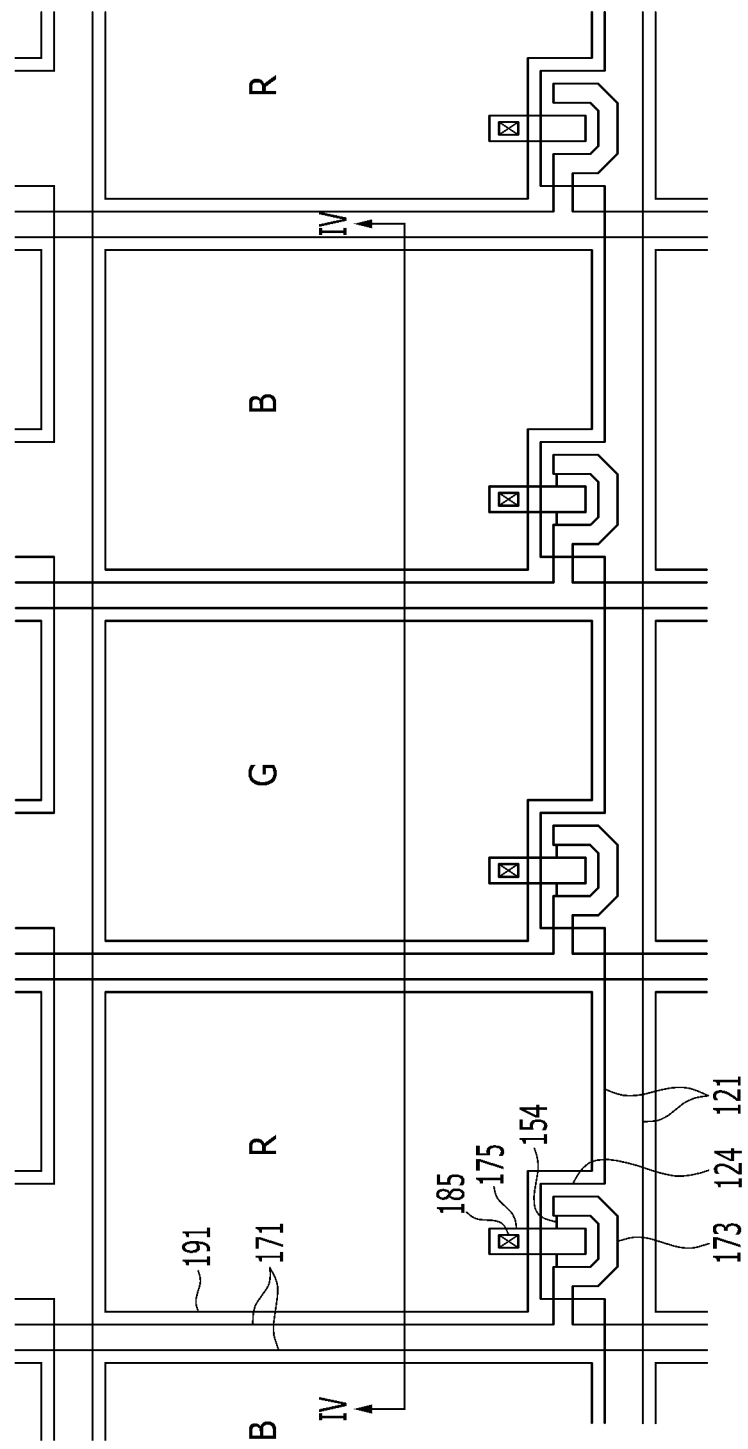
FIG. 3 is a top plan view of a display device according to an exemplary embodiment of the present invention.
Figure 4:
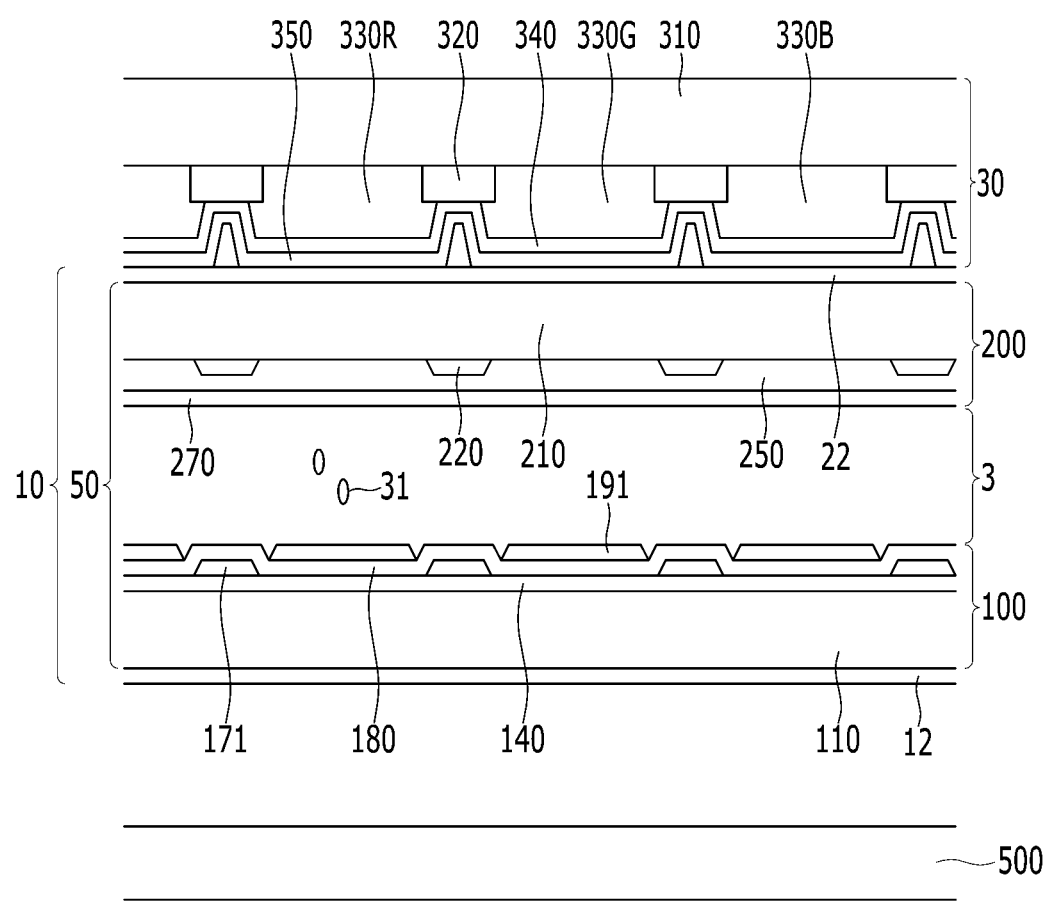
FIG. 4 is a cross-sectional view taken along the line IV-IV of FIG. 3.

Next, a display device according to an exemplary embodiment of the present invention will be described with reference to FIGS. 2, 3, and 4. FIG. 2 is a schematic cross-sectional view of a display device according to an exemplary embodiment of the present invention; FIG. 3 is a top plan view of a display device according to an exemplary embodiment of the present invention; and FIG. 4 is a cross-sectional view taken along the line IV-IV of FIG. 3.

First, referring to FIG. 2, the display device according to an exemplary embodiment of the present invention will be briefly descried, wherein the display device includes a color conversion panel 30, a display panel 10 in contact with color conversion panel 30, and a light assembly 500. The color conversion panel 30 according to an exemplary embodiment of the present invention may be the color conversion panel described with reference to FIG. 1, thus, a detailed description thereof may not be repeated. However, in this case of the color conversion panel 30, the substrate 310 shown in FIG. 1 may be positioned to be separated far from the display panel 10. The substrate 310 of the color conversion panel 30 may be disposed most remotely with reference to the display panel 10.

The display panel 10 may include a liquid crystal panel for forming a vertical electric field, however it is not limited thereto, and it may be a display panel, such as a liquid crystal panel for forming a horizontal electric field, a plasma display panel (PDP), an organic light emitting diode display (OLED), a surface conduction electron-emitter display (SED), a field emission display (FED), a vacuum fluorescent display (VFD), or an e-paper. Next, the display panel 10 may be described in further detail.

The light assembly 500 may include a light source positioned under the display panel 10 and generating light, and a light guide for receiving the light and for guiding the received light in the direction of the display panel 10 and the color conversion panel 30. When the display panel 10 is a self-emissive display device, the light assembly 500 may be omitted.

As an example of one embodiment of the present invention, the light assembly 500 may include at least one light emitting diode (LED), such as a blue light emitting diode (LED). The light source according to embodiments of the present invention may be an edge-type light assembly disposed on at least one side of the light guide plate, or may be a direct-type where the light source of the light assembly 500 is positioned in a directly lower portion of the light guide plate; however, embodiments of the present invention are not limited thereto.

Next, the display panel 10 according to an exemplary embodiment of the present invention will be described in further detail with reference to FIG. 3 and FIG. 4.

The display panel 10 may include a liquid crystal panel 50 for illustrating (or displaying) an image and first and second polarizers 12 and 22 on respective surfaces of the liquid crystal panel 50. The first polarizer 12 and the second polarizer 22 for polarization of the light incident from the light assembly 500 are positioned at respective surfaces of the liquid crystal panel 50.

The polarizers 12 and 22 may be at least one of a coating polarizer and a wire grid polarizer. These polarizers 12 and 22 may be positioned at one surface of the display panel 100 and 200 by various methods, such as a film method, a coating method, an adhering method, and/or the like. However, this description is one example and embodiments of the present invention are not limited thereto.

The liquid crystal panel 50 includes a lower panel 100 including a thin film transistor to display the image, an upper panel 200 including a second substrate 210 facing the lower panel 100, and a liquid crystal layer 3 interposed between the lower panel 100 and the upper panel 200.

A plurality of pixel electrodes are positioned in a matrix shape on a first substrate 110 included in the lower panel 100.

A gate line 121 extending in a row direction and including a gate electrode 124, a gate insulating layer 140 positioned on the gate line 121, a semiconductor layer 154 positioned on the gate insulating layer 140, a data line 171 positioned on the semiconductor layer 154, extending in a column direction, and including a source electrode 173, a drain electrode 175, a passivation layer 180 positioned on the data line 171 and the drain electrode 175, and a pixel electrode 191 electrically and physically connected to the drain electrode 175 through a contact hole 185 are positioned on the first substrate 110.

The semiconductor layer 154 positioned on the gate electrode 124 forms a channel layer in a region that is exposed by the source electrode 173 and the drain electrode 175, and the gate electrode 124, the semiconductor layer 154, the source electrode 173, and the drain electrode 175 form one thin film transistor.

Next, the upper panel 200 will be described.

The second substrate 210 faces and is separated from the first substrate 110. A light blocking member 220, a planarization layer 250, and a common electrode 270 are positioned between the second substrate 210 and the liquid crystal layer 3. In detail, the light blocking member 220 is positioned at one surface of the second substrate 210 facing toward the first substrate 110. The planarization layer 250 is positioned at one surface of the light blocking member 220 facing toward the first substrate 110, and the planarization layer 250 may provide the flat surface. The common electrode 270 is positioned at one surface of the planarization layer 250 facing toward the first substrate 110. The planarization layer 250 may be omitted in some exemplary embodiments.

The common electrode 270 applied with a common voltage forms an electric field with the pixel electrode 191 to arrange liquid crystal molecules 31 positioned in the liquid crystal layer 3 between the common electrode 270 and the pixel electrode 191.

The liquid crystal layer 3 includes a plurality of liquid crystal molecules 31, and an arrangement direction of the liquid crystal molecules 31 is controlled by an electric field between the pixel electrode 191 and the common electrode 270. According to the arrangement of the liquid crystal molecules, transmittance of light received from the light assembly 500 may be controlled to display an image.

The above-described display device provides further improved (e.g., increased) color reproducibility and contrast ratio through the color conversion panel.

Figure 5:
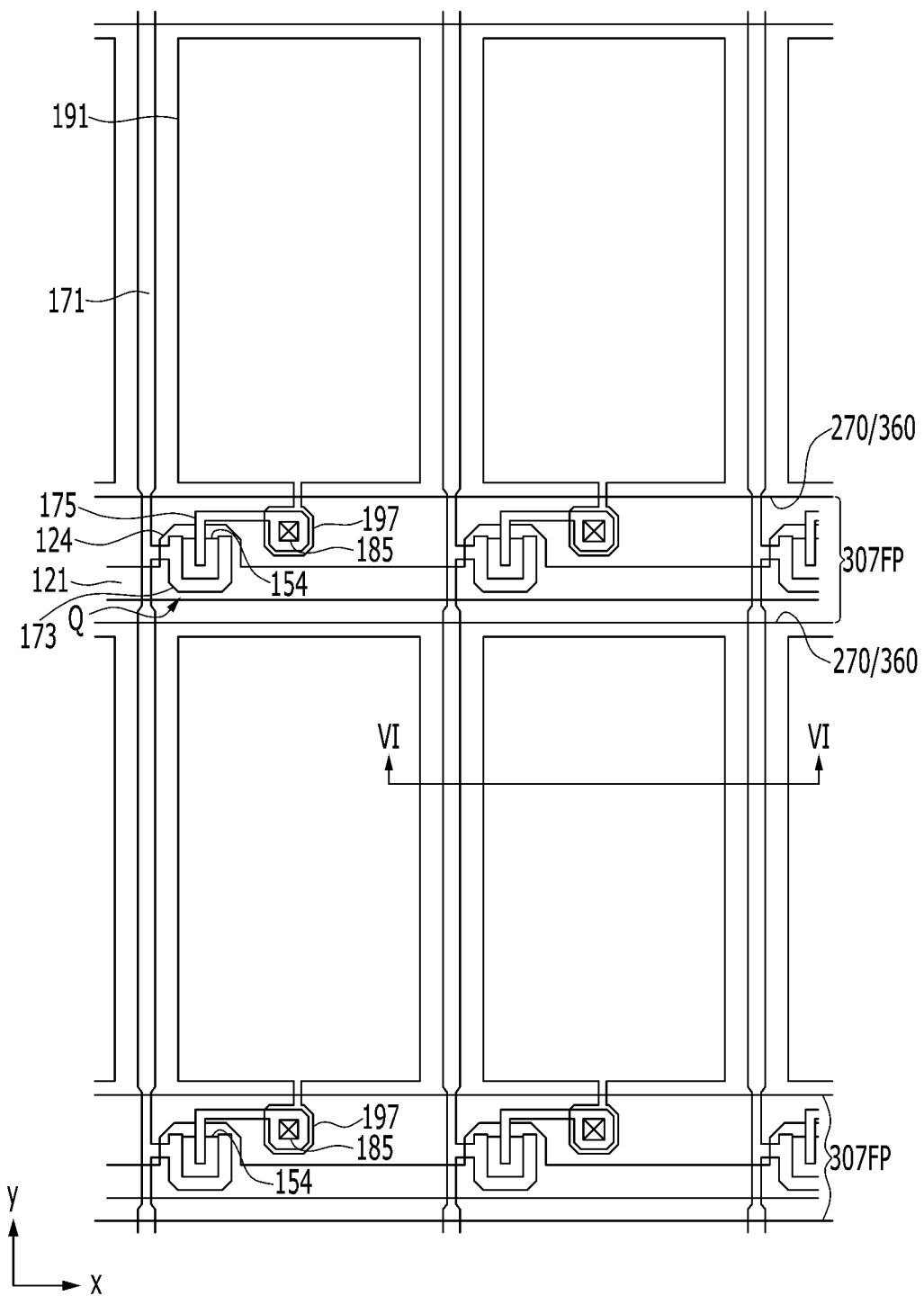
FIG. 5 is a top plan view of one pixel of a display device according to an exemplary embodiment of the present invention.
Figure 6:
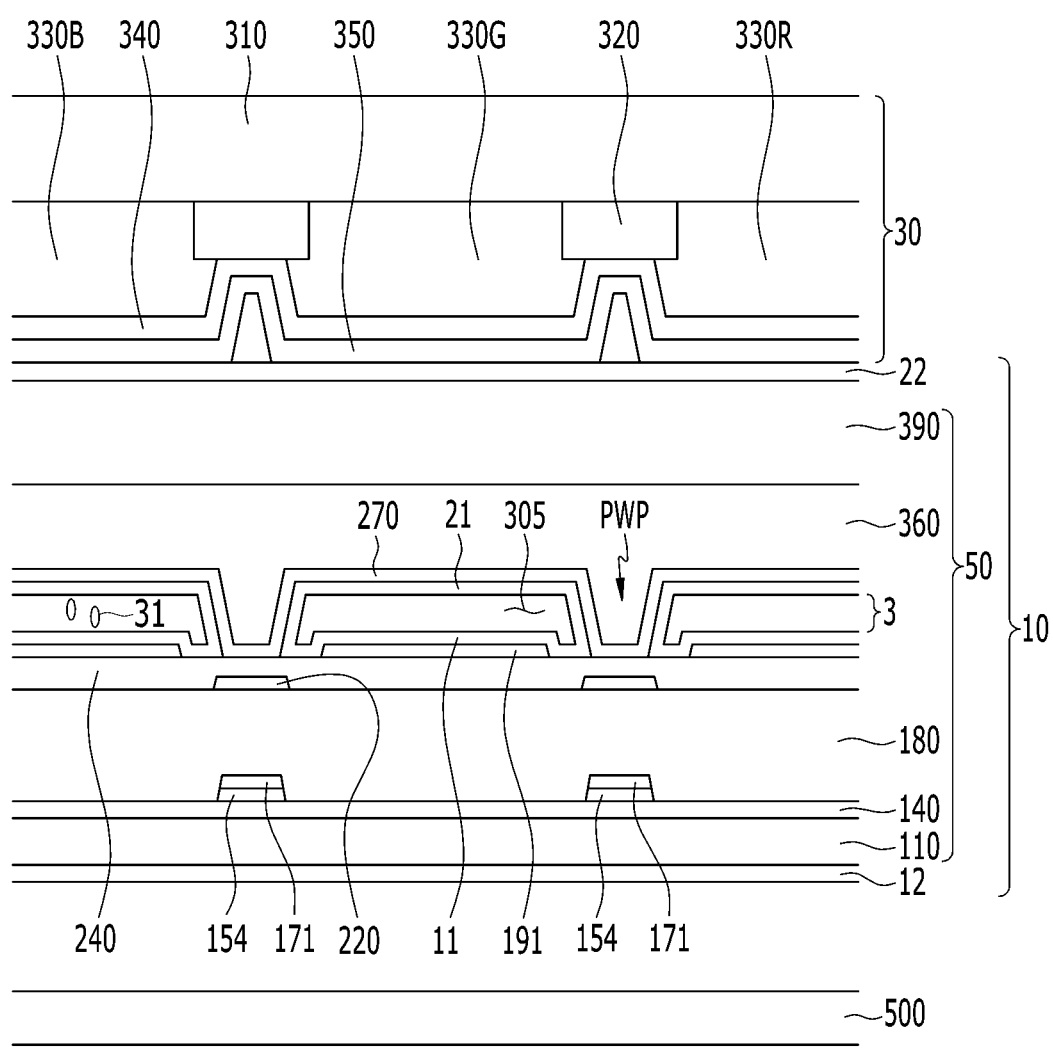
FIG. 6 is a cross-sectional view taken along the line VI-VI of FIG. 5.

Next, the display device according to an exemplary embodiment of the present invention will be described with reference to FIG. 5 and FIG. 6. FIG. 5 is a top plan view of one pixel of a display device according to an exemplary embodiment of the present invention; and FIG. 6 is a cross-sectional view taken along the line VI-VI of FIG. 5.

The display device according to an exemplary embodiment of the present invention includes the color conversion panel 30, the display panel 10, and the light assembly 500. The display panel 10 may be positioned on the light assembly 500, and the color conversion panel 30 may be positioned on the display panel 10.

The color conversion panel 30 and the light assembly 500 included in the display device according to an exemplary embodiment of the present invention are the same or substantially the same as in the above-described exemplary embodiment, thus, the description thereof is not repeated. However, to dispose the substrate 310 included in the color conversion panel 30 to be far away from the display panel 10, the color conversion panel 30 may be positioned. For example, the color conversion panel 30 is reversed on the display panel 10 such that the substrate 310 may be disposed in the top.

The display panel 10 may include a liquid crystal panel 50 for displaying an image, and polarizers 12 and 22 positioned on respective surfaces of the liquid crystal panel 50. A first polarizer 12 and a second polarizer 22 for polarization of the light incident from the light assembly 500 are positioned at respective surfaces of the liquid crystal panel 50.

A gate line 121 is positioned on the substrate 110 in the liquid crystal panel 50. The gate line 121 includes a gate electrode 124.

A gate insulating layer 140 is positioned on the substrate 110 and the gate line 121. On the gate insulating layer 140, a semiconductor layer 154 is positioned under a data line 171 and source/drain electrodes 173 and 175 and on a channel part of the thin film transistor Q.

On each semiconductor layer 151 and 154 and the gate insulating layer 140, a data conductor (171, 173, and 175) including the source electrode 173, the data line 171 connected to the source electrode 173, and the drain electrode 175 is positioned.

The gate electrode 124, the source electrode 173, and the drain electrode 175 form the thin film transistor Q along the semiconductor layer 154, and the channel of the thin film transistor Q is formed in the semiconductor layer 154 between the source electrode 173 and the drain electrode 175.

A first passivation layer 180 may be positioned on the data conductor (171, 173, and 175) and the exposed semiconductor layer 154. A light blocking member 220 and a second passivation layer 240 are positioned on the first passivation layer 180.

The light blocking member 220 is formed in a lattice structure having an opening corresponding to a region for displaying an image, and is made of an opaque material (e.g., a material through which light is not transmitted).

The first and second passivation layers 180 and 240 and the light blocking member 220 have a contact hole 185 that exposes the drain electrode 175.

A pixel electrode 191 is positioned on the second passivation layer 240. The pixel electrode 191 includes a protrusion 197 extending toward the gate line 121 from the pixel electrode 191, and the protrusion 197 is physically and electrically connected to the drain electrode 175 through the contact hole 185, thereby receiving a data voltage from the drain electrode 175.

The thin film transistor Q and the pixel electrode 191 described above are only described as examples, and the structure of the thin film transistor and design of the pixel electrode are not limited to the structure described in the present exemplary embodiment, and may be modified to be applied based on the description according to an exemplary embodiment of the present invention.

A lower alignment layer 11 is positioned on the pixel electrode 191, and the lower alignment layer 11 may be a vertical alignment layer. An upper alignment layer 21 is positioned to face the lower alignment layer 11, and a microcavity 305 is positioned between the lower alignment layer 11 and the upper alignment layer 21.

In the present exemplary embodiment, the lower alignment layer 11 and the upper alignment layer 21 are distinguished from each other based on their positions (and may otherwise be the same or substantially the same), and may be connected to each other, as shown in FIG. 6. The lower alignment layer 11 and the upper alignment layer 21 may be concurrently or simultaneously formed.

The microcavity 305 is injected with the liquid crystal molecules 31 to form the liquid crystal layer 3. A liquid crystal inlet 307FP is formed on a portion where the thin film transistor Q is positioned, and the liquid crystal inlet 307FP may be covered by an overcoat 390. The microcavity 305 is partitioned in a Y-axis direction by a plurality of liquid crystal inlets 307FP positioned at portions overlapped with the gate line 121, so as to form the plurality of microcavities 305. In addition, the microcavity 305 is partitioned in an X-axis direction by a partition wall part PWP to be described below, so as to form the plurality of microcavities 305. Each of the plurality of formed microcavities 305 may correspond to one, two, or more pixel regions, and the pixel region may correspond to a region displaying a screen.

A common electrode 270 is positioned on the upper alignment layer 21. The common electrode 270 receives a common voltage and generates an electric field together with the pixel electrode 191, to which the data voltage is applied, to determine a direction in which the liquid crystal molecules 31 positioned at the microcavities 305 between the two electrodes are inclined. In the present exemplary embodiment, the common electrode 270 is positioned on the microcavities 305, however, the common electrode 270 may alternatively be positioned under the microcavities 305 as another exemplary embodiment to realize the liquid crystal driving according to a coplanar electrode (CE) mode.

A roof layer 360 is positioned on the lower insulating layer 350. The roof layer 360 serves as a support so that the microcavity 305, which is a space between the pixel electrode 191 and the common electrode 270, is formed.

In the present exemplary embodiment, the partition wall part PWP is positioned between the microcavities 305 adjacent in the X-axis direction. The partition wall part PWP may be formed along the Y-axis direction as the direction in which the data line 171 extends and may be covered by the roof layer 360. The partition wall part PWP is filled with the common electrode 270 and the roof layer 360, and the microcavities 305 may be divided or defined as this structure forms a partition wall.

An overcoat 390 is positioned on the roof layer 360. In the present exemplary embodiment, the overcoat 390 may be positioned in the liquid crystal inlet 307FP as well as on an upper insulating layer. In this case, the overcoat 390 may cover the liquid crystal inlet 307FP.

The display device according to an exemplary embodiment of the present invention is improved in terms of contrast ratio and color reproducibility, thereby providing a display device with excellent display quality, and one sheet substrate is used, thereby simplifying the manufacturing process and the structure.

Figure 7:
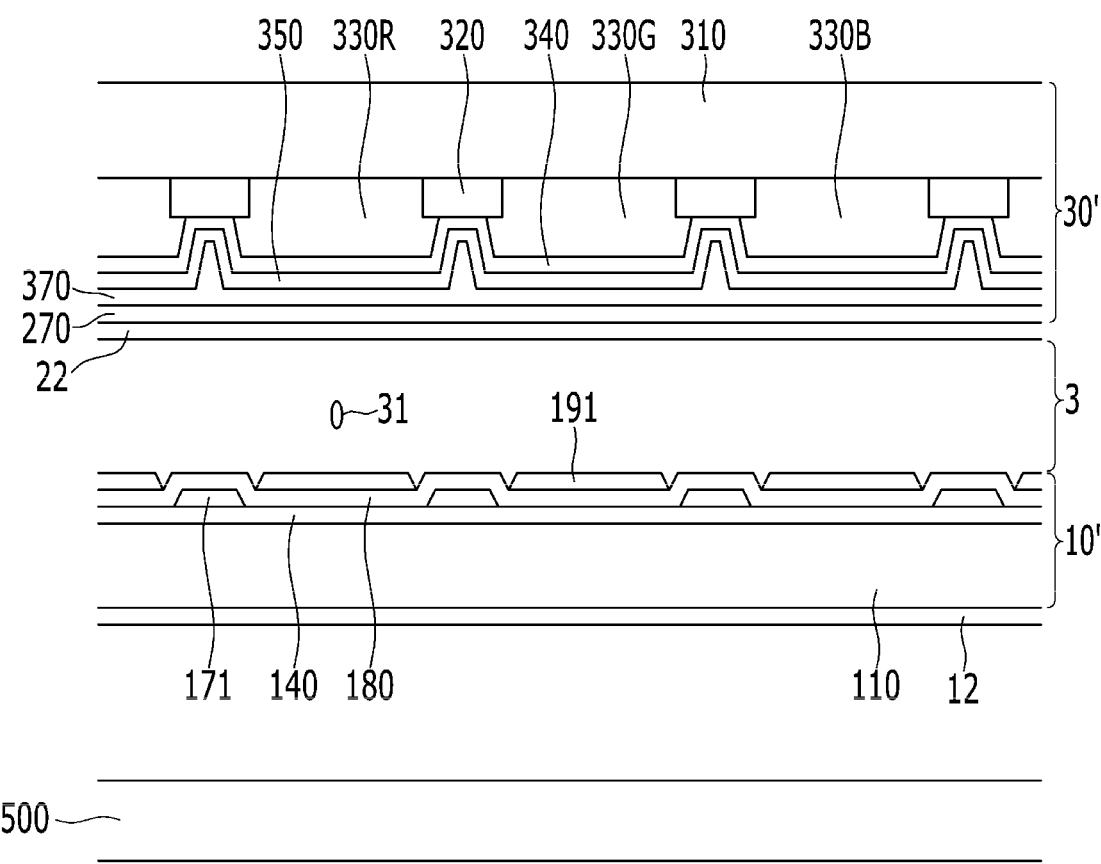
FIG. 7 is a cross-sectional view of a display device according to an exemplary embodiment of the present invention.

The display device according to an exemplary embodiment of the present invention will now be described with reference to FIG. 7. FIG. 7 is a cross-sectional view of a display device according to an exemplary embodiment of the present invention.

The display device according to an exemplary embodiment of the present invention shown in FIG. 7 includes a thin film transistor panel 10', a color conversion panel 30', and a light assembly 500. The light assembly 500 is the same or substantially the same as the above-described constituent element, thus, a description thereof is not repeated.

The display device according to an exemplary embodiment of the present invention includes the thin film transistor panel 10', the color conversion panel 30' facing and separated from the thin film transistor panel 10', and a liquid crystal layer 3 positioned between the thin film transistor panel 10' and the color conversion panel 30' and including the liquid crystal molecules.

The display device according to the present specification may further include the first polarizer 12 and the second polarizer 22 respectively positioned on one surface of the thin film transistor panel 10' and the color conversion panel 30'. According to an exemplary embodiment, the second polarizer 22 may be positioned on one surface of the color conversion panel 30' facing toward the thin film transistor panel 10'. For example, the second polarizer 22 may be an in-cell polarizer.

The thin film transistor panel 10' according to the present exemplary embodiment is the same or substantially the same as the lower panel 100 of FIG. 4 and the color conversion panel 30' is similar to the color conversion panel 30 of FIG. 1, such that, in the relevant description, FIG. 1, FIG. 3, and FIG. 4 may be referred to as well as FIG. 7.

First, a plurality of pixel electrodes are positioned in a matrix shape on the first substrate 110 included in the thin film transistor panel 10'.

A gate line 121 extending in a row direction and including a gate electrode 124; a gate insulating layer 140 positioned on the gate line 121; a semiconductor layer 154 positioned on the gate insulating layer 140, a data line 171 positioned on the semiconductor layer 154, extending in a column direction, and including a source electrode 173; a drain electrode 175; a passivation layer 180 positioned on the data line 171 and the drain electrode 175; and a pixel electrode 191 electrically and physically connected to the drain electrode 175 through a contact hole 185 are positioned on the first substrate 110.

The semiconductor layer 154 positioned on the gate electrode 124 forms a channel layer in the region that is exposed by the source electrode 173 and the drain electrode 175, and the gate electrode 124, the semiconductor layer 154, the source electrode 173, and the drain electrode 175 form one thin film transistor.

Next, the second substrate 210 faces the first insulation substrate 110 to be separated therefrom. The plurality of color conversion layers 330R and 330G and the transmission layer 330B, and the light blocking member 320 positioned between the plurality of color conversion layers 330R and 330G and the transmission layer 330B, are positioned between the substrate 310 and the liquid crystal layer 3. In detail, the plurality of color conversion layers 330R and 330G, the transmission layer 330B, and the light blocking member 320 are positioned on one surface of the substrate 310 facing toward the first substrate 110.

The light blocking member 320 defines a region where the red color conversion layer 330R, the green color conversion layer 330G, and the transmission layer 330B are disposed. The red color conversion layer 330R, the green color conversion layer 330G, and the transmission layer 330B are positioned between the light blocking members 320.

The red color conversion layer 330R may convert blue light supplied from the light assembly 500 into red, and the green color conversion layer 330G may convert blue light supplied from the light assembly 500 into green. For this, the red color conversion layer 330R and the green color conversion layer 330G may include at least one of the phosphor and the quantum dots.

The transmission layer 330B is made of the transparent polymer and transmits the blue light supplied from the light assembly 500, thereby representing the color blue. For example, the transmission layer 330B corresponding to the region emitting the blue light may include a material (e.g., a polymer, such as a photosensitive resin) emitting the incident blue light as it is without the additional phosphors (or phosphor layer) or the quantum dots.

Next, the capping layer 340 is positioned on one surface of the plurality of color conversion layers 330R and 330G, the transmission layer 330B, and the light blocking member 320 facing toward the first substrate 110. The capping layer 340 prevents or substantially prevents the color conversion layers 330R and 330G from being damaged by a following process after forming the capping layer 340. In detail, in a process after forming the color conversion layers 330R and 330G, the phosphors (or phosphor layer) and the quantum dots included in the color conversion layers 330R and 330G and the transmission layer 330B may be damaged and extinguished by the moisture and the high temperature, however the damage and the extinction are prevented or substantially prevented through the capping layer 340 according to an exemplary embodiment of the present invention.

In this case, the capping layer 340 may be formed at less than 100° C. Compared with the capping layer deposited at a high temperature, the capping layer 340 according to an exemplary embodiment of the present invention deposited at a low temperature may prevent or substantially prevent the degradation of the color conversion layer.

To protect the color conversion layers 330R and 330G and the transmission layer 330B, the capping layer 340 may be deposited to cover one exposed surface of the color conversion layers 330R and 330G and the transmission layer 330B. In detail, the capping layer 340 may cover one surface and each lateral surface of the plurality of color conversion layers 330R and 330G and the transmission layer 330B facing toward the first substrate 110.

The capping layer 340 may be the inorganic material, and as one example, a silicon nitride ($SiN_x$). However, it is not limited to the material, and the capping layer may use any suitable material that is non-oxidizing and transparent.

The thickness of the capping layer 340 may be less than 1 μm, in order to protect the plurality of color conversion layers from the high temperature or the moisture.

The filter layer 350 is positioned on one surface of the capping layer 340 facing toward the first substrate 110. In the present specification, the capping layer 340 and the filter layer 350 are positioned on one surface of the light blocking member 320 facing toward the first substrate 110; however, embodiments of the present invention are not limited thereto, and the capping layer 340 and the filter layer 350 may be positioned on one surface of the color conversion layers 330R and 330G and the transmission layer 330B facing toward first substrate 110, and the light blocking member may be positioned on one surface of the filter layer 350 facing toward the first substrate 110, or the light blocking member may be positioned on one surface of the capping layer 340 facing toward the first substrate 110 and the filter layer may be positioned on one surface of the capping layer and the light blocking member facing toward the first substrate 110 as another exemplary embodiment.

The filter layer 350 again directs the light emitted in the direction opposite to the direction incident on the user to the color conversion layers 330R and 330G and the transmission layer 330B while the light is emitted or transmitted in the color conversion layers 330R and 330G and the transmission layer 330B, thereby improving (e.g., increasing) light emission efficiency. In some exemplary embodiments, the filter layer 350 may be omitted.

Next, the planarization layer 370 is positioned on one surface of the filter layer 350 facing toward the first substrate 110. The planarization layer 370 may provide the flat surface, and the common electrode 270 is positioned on one surface of the planarization layer 370 facing toward the first substrate 110. The planarization layer 370 may be omitted in some exemplary embodiments.

The common electrode 270 applied with the common voltage forms the electric field with the pixel electrode 191 to arrange the liquid crystal molecules 31 positioned in the liquid crystal layer 3.

The liquid crystal layer 3 includes the plurality of liquid crystal molecules 31, and the arrangement direction of the liquid crystal molecules 31 is controlled by the electric field between the pixel electrode 191 and the common electrode 270. The transmittance of the light transmitted from the light assembly 500 is controlled depending on the arrangement of the liquid crystal molecules, thereby displaying the image.

The above-described display device according to an exemplary embodiment of the present invention does not include the upper panel 200 shown in FIG. 4, and the color conversion panel 30' replaces the function and the position of the upper panel. This display device may be provided with a thinner thickness and the cost and the weight thereof may be reduced.

Figure 8:
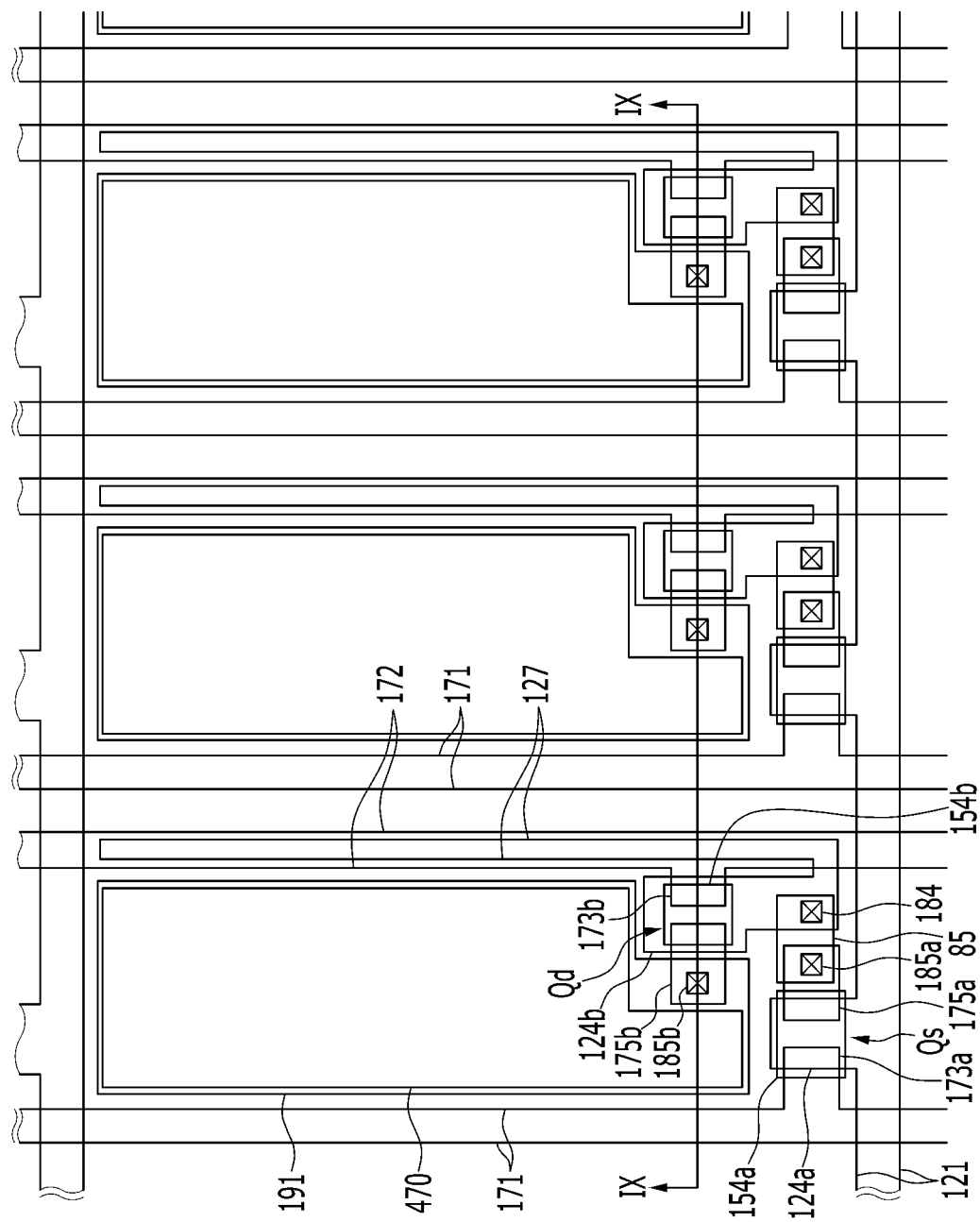
FIG. 8 is a top plan view of a plurality of pixels in an organic light emitting diode display according to an exemplary embodiment of the present invention.

The display device according to an exemplary embodiment of the present invention will be described with reference to FIG. 8 and FIG. 9. FIG. 8 is a top plan view of a plurality of pixels in an organic light emitting diode display according to an exemplary embodiment of the present invention; and FIG. 9 is a cross-sectional view taken along the line IX-IX of FIG. 8.

Figure 9:
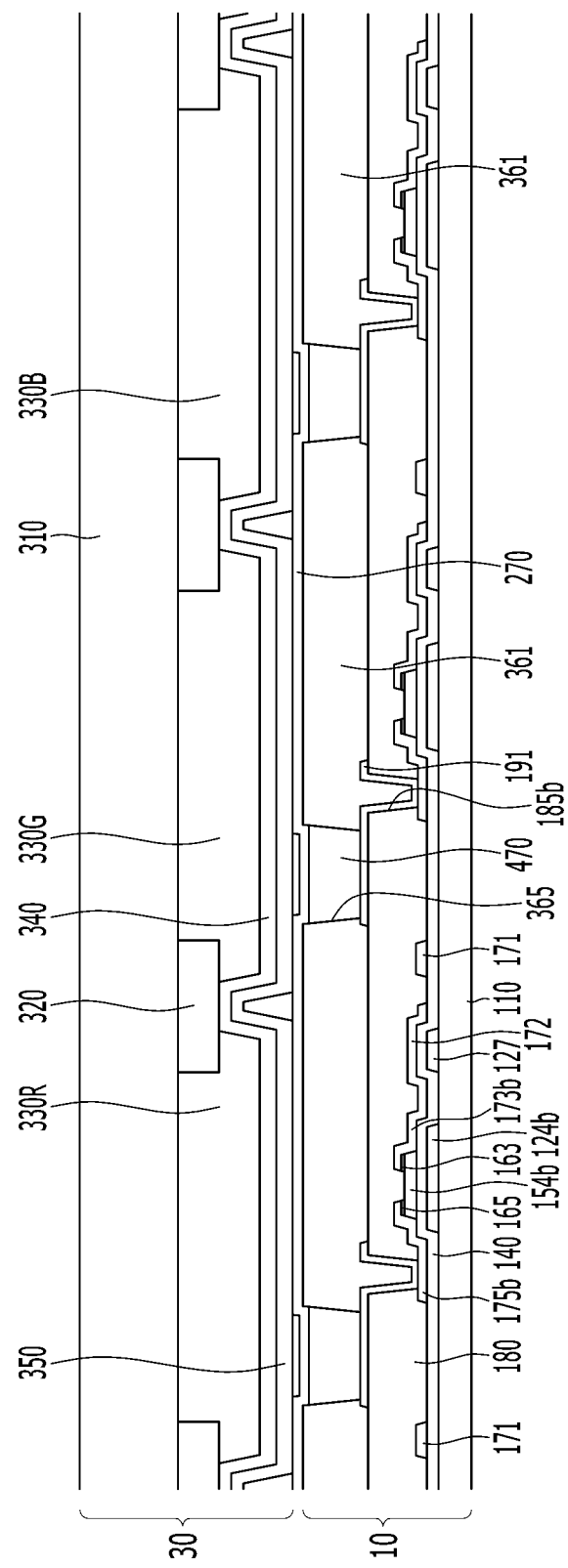
FIG. 9 is a cross-sectional view taken along the line IX-IX of FIG. 8.

The display device shown in FIG. 8 and FIG. 9 includes the display panel 10 and the color conversion panel 30 positioned on the display panel 10. The color conversion panel 30 of FIG. 8 and FIG. 9 is the same or substantially the same as the above-described color conversion panel 30 according to the exemplary embodiment of FIG. 1, thus, the description thereof is not repeated.

In the display panel 10, a gate conductor having a gate line 121 including a first gate electrode 124a and a second gate electrode 124b is positioned on the first substrate 110.

The gate line 121 transmits the gate signal. The first gate electrode 124a extends upward from the gate line 121, and the second gate electrode 124b is separated from the gate line 121 and includes a storage electrode 127.

A gate insulating layer 140 is located on the gate conductor (121, 124a, 124b, and 127).

First and second semiconductor layers 154a and 154b made of hydrogenated amorphous silicon or polysilicon are located on the gate insulating layer 140. The first and second semiconductor layers 154a and 154b are respectively positioned on the first and second gate electrodes 124a and 124b.

A plurality of pairs of ohmic contacts 163 and 165 are positioned on the first and second semiconductor layers 154a and 154b.

A plurality of data conductors including a data line 171, a driving voltage line 172, and first and second drain electrodes 175a and 175b are formed on the ohmic contacts 163 and 165 and the gate insulating layer 140.

The data line 171 and the driving voltage line 172 mainly extend in the longitudinal direction, thereby crossing the gate line 121. The data line 171 includes a plurality of first source electrodes 173a extending toward the first gate electrode 124a, and the driving voltage line 172 includes a second source electrode 173b extending toward the second gate electrode 124b.

The first and second drain electrodes 175a and 175b are separated from each other and are also separated from the data line 171 and the driving voltage line 172. The first source electrode 173a and the first drain electrode 175a face each other via the first gate electrode 124a, and the second source electrode 173b and the second drain electrode 175b face each other via the second gate electrode 124b.

The semiconductor layers 154a and 154b include parts exposed between the source electrodes 173a and 173b and the drain electrodes 175a and 175b.

A passivation layer 180 is positioned on the data conductors 171, 172, 173a, 173b, 175a, and 175b and the exposed parts of the semiconductor layers 154a and 154b.

The passivation layer 180 has contact holes 185a and 185b respectively exposing the first and second drain electrodes 175a and 175b. The passivation layer 180 and the gate insulating layer 140 have a contact hole 184 formed therethrough that exposes the second gate electrode 124b.

A pixel electrode 191 and a connecting member 85 are positioned on the passivation layer 180.

The pixel electrode 191 is physically and electrically connected to the second drain electrode 175b through the contact hole 185b, and the connecting member 85 is connected to the second gate electrode 124b and the first drain electrode 175a through the contact holes 184 and 185a.

A partition 361 is positioned on the passivation layer 180. The partition 361 encloses the edge of the pixel electrode 191 like a bank, thereby defining an opening 365, and is made of the organic insulator or the inorganic insulator. The partition 361 may be made of a photoresist including black pigments, and may function as a light blocking member in this case, thereby simplifying the manufacturing process.

An organic light emitting member 470 is formed in openings 365 defined by the partition 361 on the pixel electrode 191. The organic light emitting member 470 of the organic light emitting diode display according to the present exemplary embodiment is only made of the organic material emitting blue light. In the case of the organic light emitting diode display according to the present exemplary embodiment, the color conversion panel 30 is positioned on the upper surface of the organic light emitting diode display to represent each color of red, green, and blue such that only the organic material representing the blue light may be included.

A common electrode 270 is positioned on the organic light emitting member 470. In the organic light emitting diode display, the first gate electrode 124a connected to the gate line 121, the first source electrode 173a connected to the data line 171, and the first drain electrode 175a form a switching thin film transistor Qs along with the first semiconductor layer 154a, and the channel of the switching thin film transistor Qs is formed in the first semiconductor layer 154a between the first source electrode 173a and the first drain electrode 175a. The second gate electrode 124b connected to the first drain electrode 175a, the second source electrode 173b connected to the driving voltage line 172, and the second drain electrode 175b connected to the pixel electrode 191 form a driving thin film transistor Qd along with the second semiconductor layer 154b, and the channel of the driving thin film transistor Qd is formed in the second semiconductor layer 154b between the second source electrode 173b and the second drain electrode 175b. The pixel electrode 191, the organic light emitting member 470, and the common electrode 270 form the organic light emitting diode, and the pixel electrode 191 becomes the anode and the common electrode 270 becomes the cathode. However, in another example, the pixel electrode 191 may become the cathode and the common electrode 270 may become the anode. The storage electrode 127 and the driving voltage line 172 overlap with each other, thereby forming the storage capacitor Cst.

In the color conversion panel 30 according to an exemplary embodiment of the present invention, the substrate 310 of the color conversion panel 30 faces the first substrate 110, and the color conversion layers 330R and 330G, the transmission layer 330B, the light blocking member 320, the capping layer 340, and the filter layer 350 are disposed to be positioned on one surface of the first substrate 110 facing toward the substrate 310.

The organic light emitting diode display according to an exemplary embodiment of the present invention is improved in terms of light emission efficiency and color reproducibility, thereby providing excellent display quality.

Figure 10:
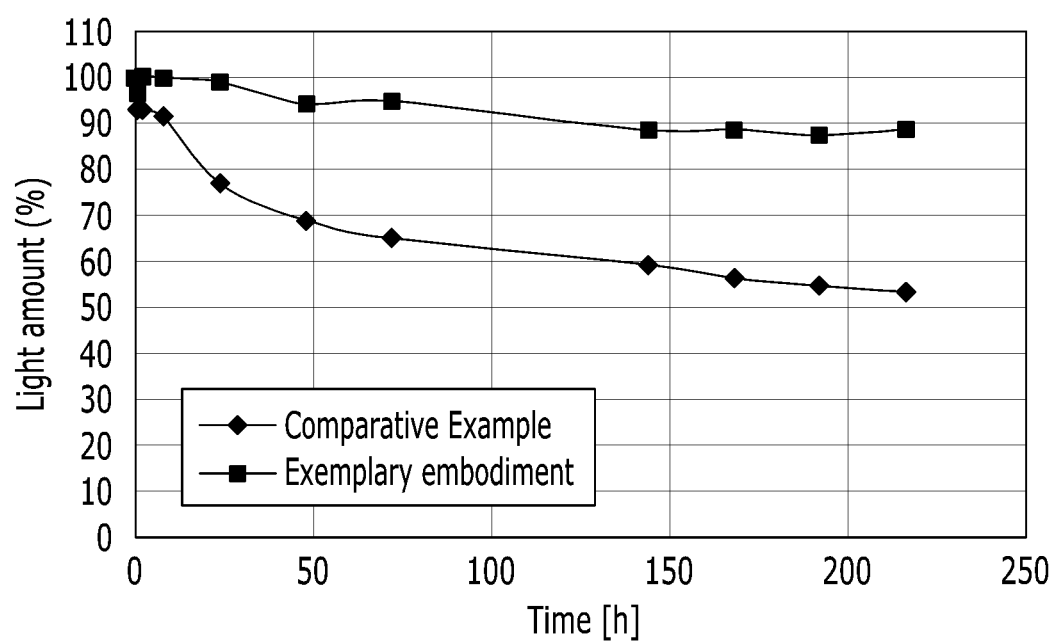
FIG. 10 is a graph comparing degradation over operating lifetime of an exemplary embodiment of the present invention and a comparative example.

Next, an exemplary embodiment of the present invention and a comparative example will be described with reference to FIG. 10. FIG. 10 is a graph comparing degradation over operating lifetime of an exemplary embodiment of the present invention and a comparative example, by comparing light amounts (e.g., light emission efficiencies) as a function of time.

Referring to FIG. 10, it may be confirmed that the color conversion panel including the capping layer on the color conversion layers according to the exemplary embodiment substantially maintains the light amount even when a long time has elapsed. In contrast, when the separate capping layer is omitted on the color conversion layers according to the comparative example, only about 50% of the initial light amount is emitted when 200 h (hours) have elapsed.

Also, as shown in Table 1, in an exemplary embodiment of the present invention, the light emission efficiency represents about 200% as compared with the comparative example, and referring to a result of FIG. 10, even if the 200 h have elapsed, it may be confirmed that the light amount of about 90% is maintained compared with the beginning.

TABLE 1

|  | Comparative Example | Exemplary Embodiment |
| --- | --- | --- |
| Light Emission Efficiency | 100% | 200% |
| Reliability | 50% | 90% |

Accordingly, the color conversion panel according to an exemplary embodiment of the present invention may provide further improved (e.g., increased) light emission efficiency and display quality.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when an element is referred to as being "between" two elements, it can be the only element between the two elements, or one or more intervening elements may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

The display device and/or any other relevant devices or components according to embodiments of the present invention described herein, such as the color conversion panel, may be implemented utilizing any suitable hardware, firmware (e.g. an application-specific integrated circuit), software, or a suitable combination of software, firmware, and hardware. For example, the various components of the display device may be formed on one integrated circuit (IC) chip or on separate IC chips. Further, the various components of the display device may be implemented on a flexible printed circuit film, a tape carrier package (TCP), a printed circuit board (PCB), or formed on a same substrate. Further, the various components of the display device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

While this invention has been described in connection with what is presently considered to be practical exemplary embodiments, it is to be understood that the invention is not limited to the disclosed embodiments, and is intended to cover various suitable modifications and equivalent arrangements included within the spirit and scope of the present invention as defined by appended claims and equivalents thereof.

DESCRIPTION OF SOME OF SYMBOLS

| 10: display panel | 12, 22: polarizer |
|---|---|
| 30: color conversion panel | 310: substrate |
| 11: first alignment layer | 21: second alignment layer |
| 110: first substrate | 121: gate line |

What is claimed is:

1. A color conversion panel comprising:
a substrate;
a plurality of color conversion layers and a transmission layer on the substrate;
a capping layer on the plurality of color conversion layers and the transmission layer; and
a filter layer on the capping layer,
wherein the capping layer covers each upper surface and each lateral surface of the plurality of color conversion layers and the transmission layer.

2. A color conversion panel comprising:
a substrate;
a plurality of color conversion layers and a transmission layer on the substrate, the transmission layer being at a same layer as the plurality of color conversion layers;
a capping layer on the plurality of color conversion layers and the transmission layer; and
a filter layer on the capping layer.

3. The color conversion panel of claim 2, further comprising
a light blocking member between adjacent layers of the plurality of color conversion layers and the transmission layer.

4. The color conversion panel of claim 2, wherein the capping layer comprises an inorganic material.

5. The color conversion panel of claim 4, wherein the capping layer comprises a non-oxidizing material.

6. The color conversion panel of claim 4, wherein the capping layer comprises a silicon nitride ($SiN_x$).

7. The color conversion panel of claim 2, wherein a thickness of the capping layer is less than about 1 μm.

8. The color conversion panel of claim 2, wherein the capping layer is formed at a temperature below about 100° C.

9. A display device comprising:
a display panel; and
a color conversion panel on the display panel,
wherein the color conversion panel comprises:
a substrate;
a plurality of color conversion layers and a transmission layer on one surface of the substrate facing toward the display panel, the transmission layer being at a same layer as the plurality of color conversion layers;
a capping layer on one surface of the plurality of color conversion layers and the transmission layer facing toward the display panel; and
a filter layer between the capping layer and the display panel.

10. The display device of claim 9, wherein the capping layer covers each upper surface and each lateral surface of the plurality of color conversion layers and the transmission layer.

11. The display device of claim 9, further comprising
a light blocking member between adjacent layers from among the plurality of color conversion layers and the transmission layer.

12. The display device of claim 9, wherein the capping layer comprises an inorganic material.

13. The display device of claim 12, wherein the capping layer comprises a non-oxidizing material.

14. The display device of claim 12, wherein the capping layer comprises a silicon nitride ($SiN_x$).

15. The display device of claim 9, wherein a thickness of the capping layer is less than about 1 μm.

\* \* \* \* \*